United States Patent
Rolandi

[19]

[11] Patent Number: 6,101,127
[45] Date of Patent: Aug. 8, 2000

[54] OPERATING VOLTAGE SELECTION CIRCUIT FOR NON-VOLATILE SEMICONDUCTOR MEMORIES

[75] Inventor: Paolo Rolandi, Voghera, Italy

[73] Assignee: STMicroelectronics S.r.l., Agrate Brianza, Italy

[21] Appl. No.: 09/229,474

[22] Filed: Jan. 13, 1999

[30] Foreign Application Priority Data

Feb. 26, 1998 [EP] European Pat. Off. .............. 98830104

[51] Int. Cl.$^7$ .................................................. G11C 16/06
[52] U.S. Cl. .................... 365/185.23; 365/233; 365/226; 365/185.18
[58] Field of Search .................... 365/185.23, 185.18, 365/185.24, 226, 233, 189.05

[56] References Cited

U.S. PATENT DOCUMENTS

| | | | |
|---|---|---|---|
| 5,363,335 | 11/1994 | Jungroth et al. .......................... | 365/226 |
| 5,615,151 | 3/1997 | Furuno et al. ...................... | 365/185.18 |
| 5,889,719 | 3/1999 | Yoo et al. ................................. | 365/226 |
| 5,912,856 | 6/1999 | Lee et al. ................................. | 365/226 |
| 5,930,170 | 3/1999 | Kunst et al. ......................... | 365/185.18 |

FOREIGN PATENT DOCUMENTS

| | | |
|---|---|---|
| 0 802 482 A1 | 10/1997 | European Pat. Off. . |
| WO 96/24135 | 8/1996 | WIPO . |

OTHER PUBLICATIONS

EPO, Partial European Search Report, Jul. 21, 1998, EP 98830104.

*Primary Examiner*—Richard Elms
*Assistant Examiner*—Tuan T. Nguyen
*Attorney, Agent, or Firm*—Jenkens & Gilchrist, P.C.; Theodore E. Galanthay

[57] ABSTRACT

An operating voltage selection circuit for non-volatile semiconductor memories, comprising: means (1) for reading at least one one-time programmable non-volatile memory cell (10), suitable to generate a signal (LV) which indicates the requested type of operating voltage of a non-volatile memory, which depends on the programmed or non-programmed state of the memory cell; memory enabling means (5), which comprise an inverter (30, 31) and are provided with means (32) for modifying the switching threshold of the inverter as a function of the signal that indicates the requested type of operating voltage; output means (2), which are connected to means for sensing data of the memory and to output terminals of the memory, comprising a CMOS inverter (20, 50) and means (23) for modifying the output current of the inverter as a function of the signal (LV) for indicating the requested type of operating voltage; and means (8) for the internal synchronization of the memory, which comprise pluralities of transistors (40, 41, 42) connected in a series/parallel configuration which is determined by the signal (LV) for indicating the requested type of operating voltage, in order to generate signals (CK1, CK2, CK3) for the internal synchronization of the memory.

27 Claims, 5 Drawing Sheets

OPERATING VOLTAGE SELECTION CIRCUIT FOR NON-VOLATILE SEMICONDUCTOR MEMORIES

TECHNICAL FIELD OF THE INVENTION

The present invention relates to an operating voltage selection circuit for non-volatile semiconductor memories. More particularly, the invention relates to an operating voltage selection circuit for non-volatile semiconductor memories which is suitable to select either a low or standard operating voltage of the non-volatile memory.

BACKGROUND OF THE INVENTION

It is known that, in the current state-of-the-art, non-volatile semiconductor, memories are designed to work in operating voltage and power supply ranges which depend on the type of application for which the memory is intended to be used. For example, if the application requires low consumption, as in the case of cellular mobile telephones, it is necessary to use a low operating voltage for the non-volatile memory of the semiconductor, i.e., a voltage between 2.7 V and 3.6 V. For some applications, instead, the requirement is limited to the standard operating voltage, i.e., a voltage between 4.5 V and 5.5 V.

From the memory manufacturing point of view, the above differences in supply voltage required by the end consumer entail considerable management problems. Manufacturing devices which are identical except for the adopted supply voltage requires producing devices according to multiple methods which depend on the desired voltage. This of course entails the need to differentiate from the very initial steps of the manufacturing process, the production of devices that operate at standard voltage and of devices that operate at low voltage. This advance planning is required depending on which kind of device is being manufactured. Production is thereby not linked to actual market demand, since manufacturers are forced to plan their production in advance, without taking into account the requirements or trends of the market. The choice of the low-voltage or standard-voltage device is thus made before the so-called testing step during which the devices are tested.

In order to meet market demand, manufacturers are forced to form a considerable stock, so as to be ready to cope with any change in the trend of demand for devices operating with either voltage that the market may seek. The aim of the present invention is to provide an operating voltage selection circuit for a non-volatile semiconductor memory in which selection of the low operating voltage or standard operating voltage is made at the testing step of said devices rather than at the beginning of the manufacturing process of the memory.

SUMMARY OF THE INVENTION

Within the scope of this aim, an object of the present invention is to provide an operating voltage selection circuit for a non-volatile semiconductor memory which simplifies production planning and eliminates uncertainties due to the need to plan in advance the types of device that the market may require.

Another object of the present invention is to provide an operating voltage selection circuit for a non-volatile semiconductor memory which allows manufacturers to reduce their stock.

Another object of the present invention is to provide an operating voltage selection circuit for a non-volatile semiconductor memory which is flexible as to the product with which it is associated.

This aim, these objects and others which will become apparent hereinafter are achieved by an operating voltage selection circuit for non-volatile semiconductor memories comprising means for reading at least one one-time programmable non-volatile memory cell, suitable to generate a signal which indicates the requested type of operating voltage of a non-volatile memory, which depends on the programmed or non-programmed state of said memory cell; memory enabling means comprising an inverter and means for modifying the switching threshold of said inverter as a function of said signal that indicates the requested type of operating voltage; output means, connected to means for sensing data of said memory and to output terminals of the memory, comprising a CMOS inverter and means for modifying the output current of said inverter as a function of said signal for indicating the requested type of operating voltage; and means for internal synchronization of said memory, comprising pluralities of transistors connected in a series/parallel configuration, said configuration being determined by said signal for indicating the requested type of operating voltage, in order to generate signals for the internal synchronization of said memory.

Further characteristics and advantages of the invention will become apparent from the description of a preferred but not exclusive embodiment of the selection circuit according to the invention, illustrated only by way of non-limitative example in the accompanying drawings.

DETAILED DESCRIPTION OF A PREFERRED EMBODIMENT

Figure 1:
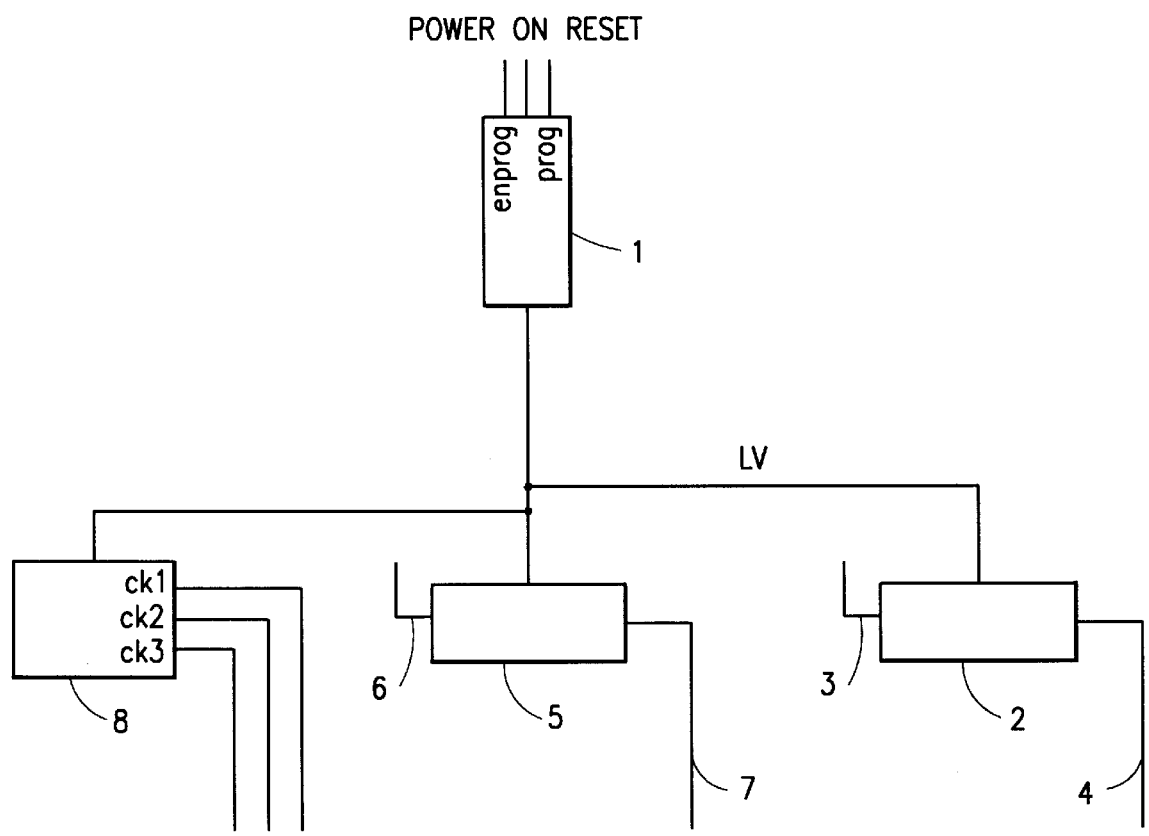
FIG. 1 is a block diagram of the portions of a non-volatile semiconductor memory affected by a control signal used in the selection circuit according to the present invention.

The selection circuit according to the present invention is introduced in the block diagram shown in FIG. 1. In said figure, the reference numeral 1 designates reading means of a non-volatile memory cell, shown in detail in FIG. 2, which receive in input the power-on reset signal and memory cell programming signals designated "enprog" and "prog." The output of the reading means 1 is a signal LV which defines the state of the supply voltage, namely high voltage or low voltage, depending on the logic value assumed by said signal.

The reading means are connected to output means, designated by the reference numeral 2, comprising an output buffer connected to the sense amplifier (not shown) of the non-volatile memory on one side and to the output pins of said memory on the other side. The connection of the sense amplifier is designated by the reference numeral 3, while the connection to the output pins of the memory is designated by the reference numeral 4.

The reading means 1 are further connected to chip enabling means 5, which receive in input a chip enabling signal 6 and emit in output a signal 7 for the internal enabling of the memory.

Finally, the reading means 1 are connected to synchronization means 8 suitable to generate a first, a second and a third synchronization signal, designated by CK1, CK2 and CK3 respectively.

FIGS. 2 to 5 illustrate in detail the circuitry of the reading means 1, of the output means 2, of the enabling means 5 and of the synchronization means 8, respectively.

Figure 2:
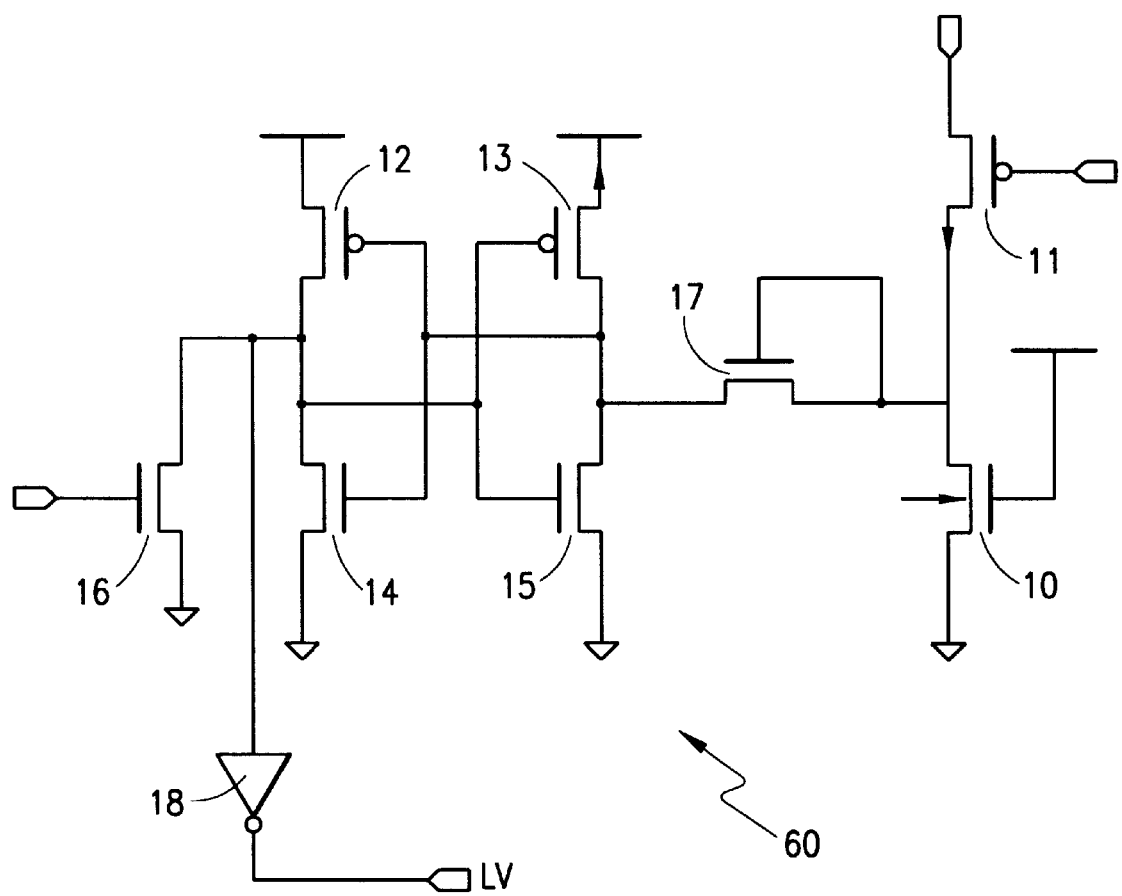
FIG. 2 is a circuit diagram of the circuit for generating the control signal of the selection circuit according to the present invention.

In detail, in FIG. 2 the reading means 1 comprise a one-time programmable non-volatile memory cell, designated by the reference numeral 10, which is programmed by the signals prog and enprog (described with reference to FIG. 1) by means of a P-channel MOS transistor 11 which acts as a switch and is series-connected to the memory cell 10. A bistable element 60 of the latch type is connected to the memory cell 10 and comprises two circuit branches comprising respectively two CMOS inverters each comprising a P-channel MOS transistor, designated 12 and 13, respectively, and an N-channel MOS transistor, designated 14 and 15, respectively.

In particular, a first branch of the latch 60, the one formed by the transistors 12 and 14, receives the power-on reset signal by means of an N-channel MOS transistor 16, while the second branch, formed by the transistors 13 and 15, is connected to the non-volatile memory cell 10 through the interposition of an N-channel MOS transistor 17.

An inverter 18 is connected at a common point between the drain terminals of the MOS transistors 12 and 14. The output from the inverter 18 is the signal LV described with reference to FIG. 1.

Figure 3:
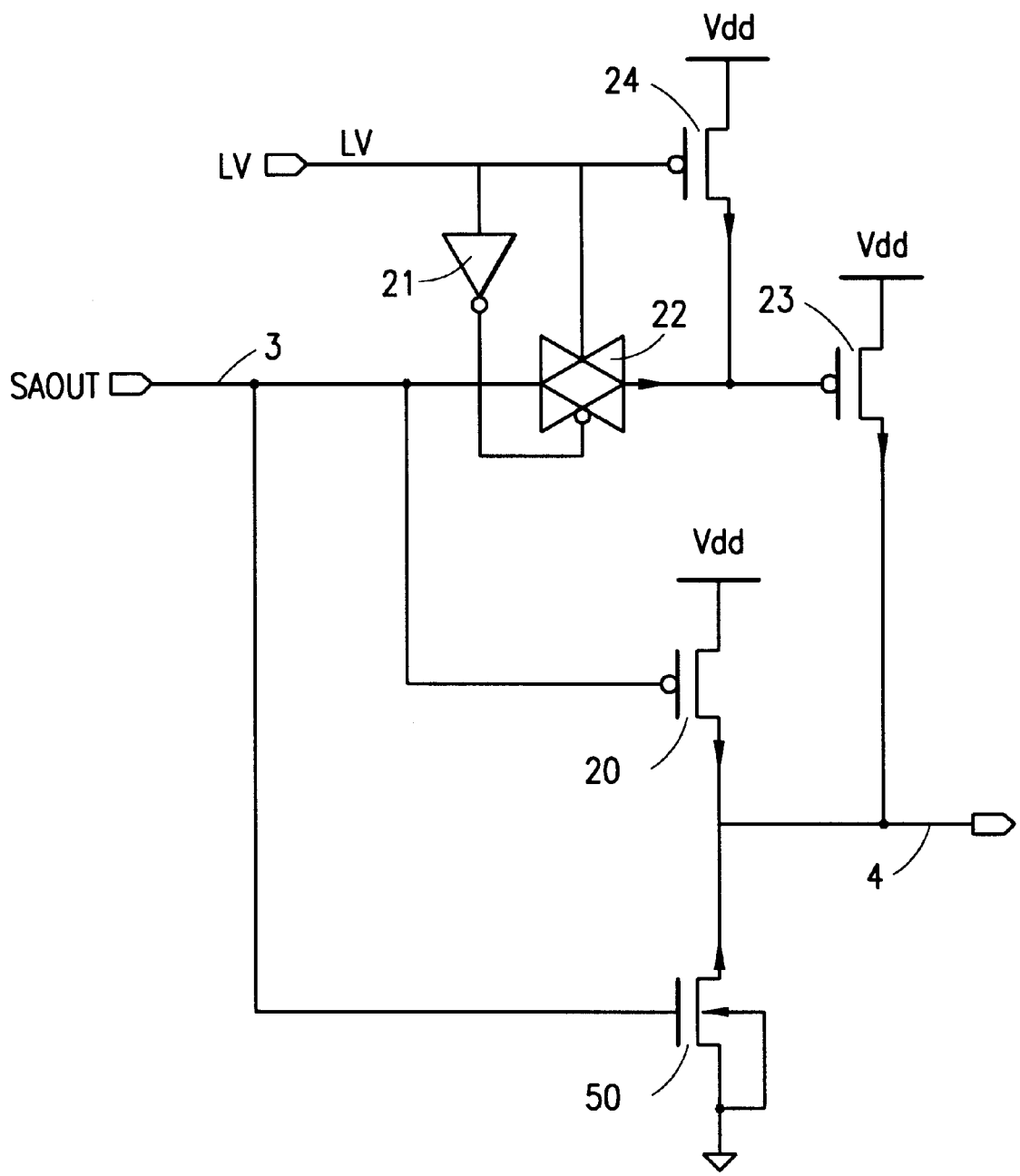
FIG. 3 is a circuit diagram of the output buffer of the non-volatile semiconductor memory, modified according to the present invention.

With reference now to FIG. 3, said figure illustrates the output means 2 (shown in FIG. 1), which are a conventional output driver formed by a CMOS inverter, with transistors 20 and 50 of the P and N types respectively, in which the P-channel MOS transistor 20 is connected to the circuit portion that comprises an inverter 21 which receives in input the signal LV, and in which the output is connected to a pass transistor 22, which also receives the signal LV in input and in which the output is connected to means for modifying the current in output from the MOS transistor 20. Advantageously, said modification means comprise a P-channel MOS transistor 23 in which the gate terminal is connected to the output of the pass transistor 22. The drain terminal of the transistor 23 is connected to the common drain terminals of the MOS transistors 20 and 21.

An additional P-channel MOS transistor 24 is connected between the supply voltage and the gate terminal of the P-channel MOS transistor 23. The signal LV is also input to the gate terminal of the MOS transistor 24.

The circuit of FIG. 3 receives in input the signal 3 (saout), described with reference to FIG. 1, that arrives from the sense amplifier and a signal LV.

Figure 4:
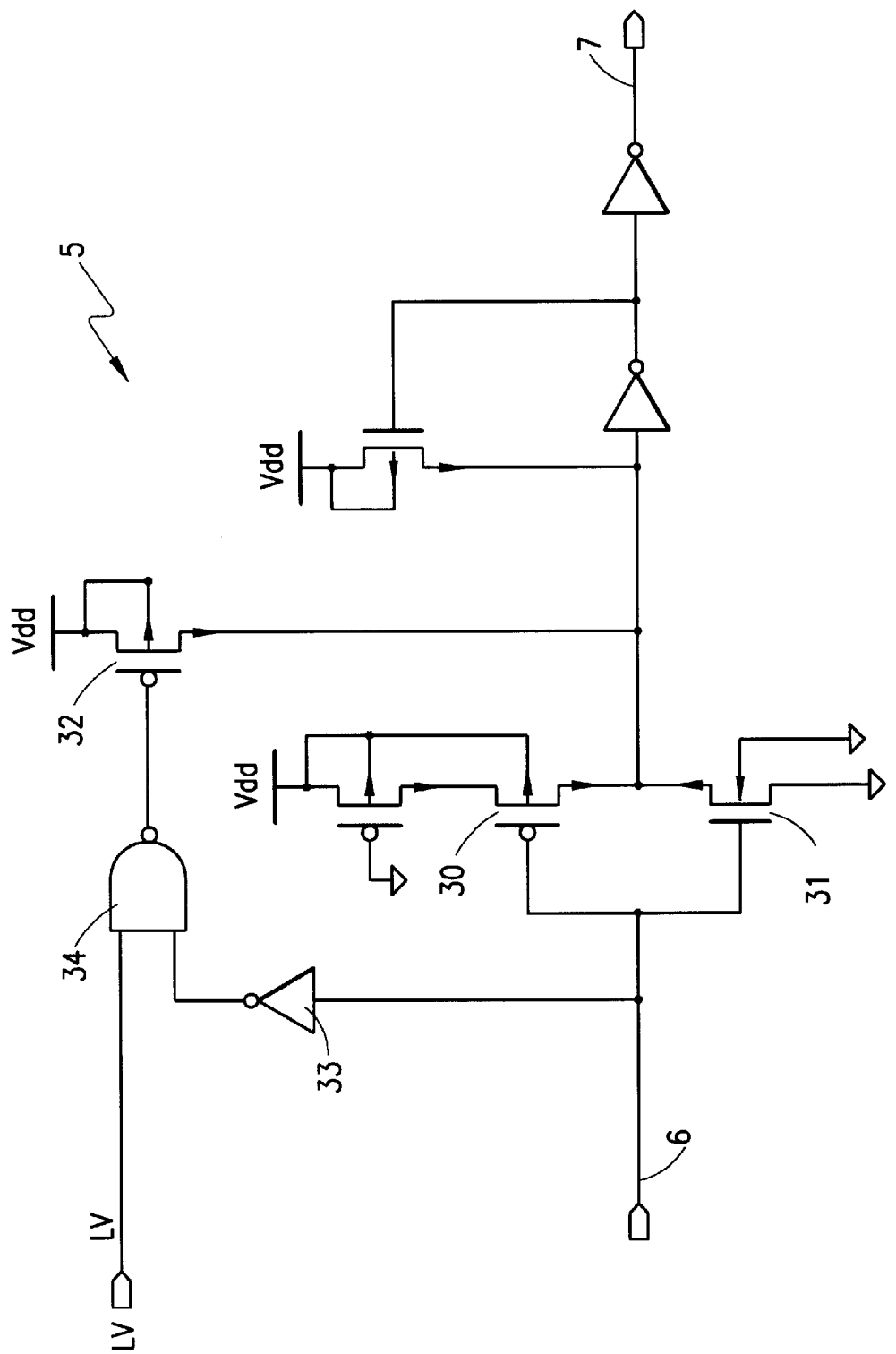
FIG. 4 is a circuit diagram of the enabling buffer of the chip modified according to the present invention.

FIG. 4 illustrates the enabling means of the chip, designated by the reference numeral 5 in FIG. 1. The chip enabling buffer 5 comprises an inverter formed by a P-channel MOS transistor 30 which is series-connected to an N-channel MOS transistor 31. The transistors 30 and 31 receive the signal 6 in input to the respective gate terminals.

Means for modifying the switching threshold of the inverter are connected to said inverter. The means for modifying the switching threshold comprise a further circuit branch which is formed by a P-channel MOS transistor 32 which is parallel-connected to the P-channel MOS transistor 30 of the inverter of the chip enabling buffer 5. The signal in input to the gate terminal of the MOS transistor 32 is a signal obtained by combining the signal LV with the signal 6, appropriately inverted by an inverter 33, through logic means 34, which are conveniently provided by a NAND logic gate. The remaining part of the circuit shown in FIG. 4 is of a known type and is therefore not described in detail herein.

Figure 5:
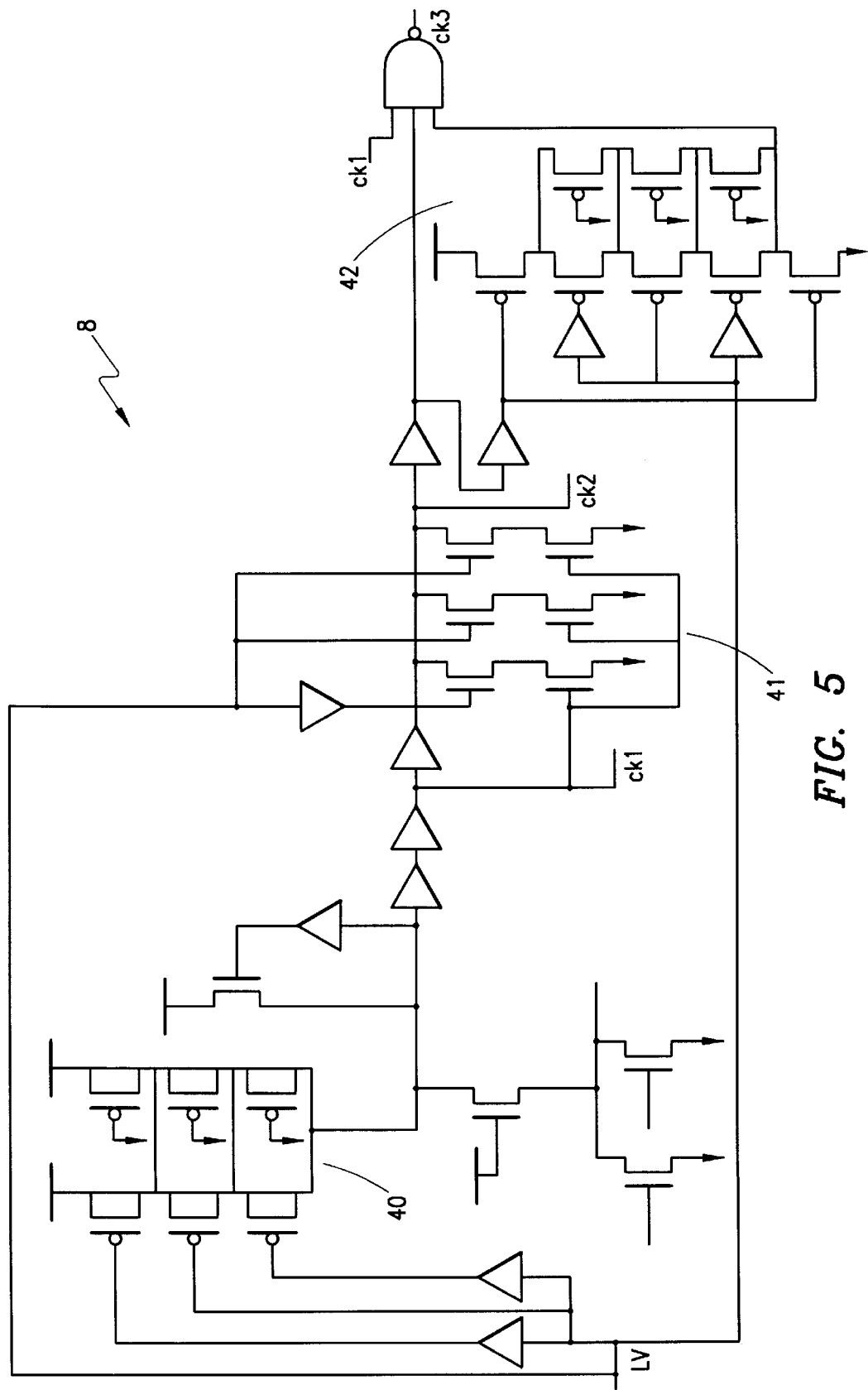
FIG. 5 is a circuit diagram of the portion for generating timing signals for the non-volatile semiconductor memory according to the present invention.

Finally, FIG. 5 illustrates the synchronization means 8 which are suitable to generate the signals CK1, CK2 and CK3. In detail, the circuit shown in FIG. 5 comprises a first, a second and a third plurality of P-channel and N-channel MOS transistors which are series/parallel connected and are designated by the reference numerals 40, 41 and 42 respectively. The signal LV is fed in input to the gate terminals of the MOS transistors of the pluralities of MOS transistors 40, 41 and 42. The signal CK1 corresponds to the address transition sense signal, the signal CK2 corresponds to the equalization or precharge signal, and the signal CK3 corresponds to the enable signal of the output buffer 5.

With reference now to the above figures, operation of the selection circuit according to the present invention is as follows.

The operating class of device, i.e., either the standard voltage class or the low-voltage class, is determined according to the charge state of the one-time programmable non-volatile cell 10. Assuming, by way of example, that the operating class of the device that corresponds to the non-programmed state of the cell 10 is the standard voltage class, chip enabling buffer circuits 5 which operate at standard voltage, the internal timing or synchronization means 8 optimized for standard voltage and the dimensions of the output buffer 2 are activated in this condition. If the cell 10 is programmed, the above circuits are enabled for low-voltage operation. This operation can be performed during testing, after memory assembly. It is in fact sufficient to send the enprog and prog signals in order to determine the programmed or non-programmed state of the memory cell 10, from which all of the previously described conditions derive.

In the circuit of FIG. 2, the charge state of the memory cell 10 determines the value of the signal LV during device power-on. When the power supply is connected to the device, the known power-on reset signal is produced and is applied to the first branch of the latch 60 (i.e., to the branch formed by the transistors 12 and 14), while the other branch of the latch is connected to the memory cell 10. If the cell is virgin, i.e., the cell is conducting, when the power supply reaches its stable level, be it 2.7–3.6 V (low voltage) or 4.5–5.5 V (standard voltage), said cell 10 switches the content of the latch 60 which had been preset by the power-on reset signal. The value of the signal LV in this case becomes "0" and the standard voltage interval is thus selected. If instead the cell is programmed, the content of the latch 60 is not modified, the output LV remains at the logic level "1" and the low-voltage range is thus selected. The logic state of the signal LV, either 1 or 0, can of course be the reverse of what has been described above.

The circuit of FIG. 3, which is a conventional output driver, with the addition of a branch to the PMOS transistor 20, behaves as follows. Assuming for example that the signal LV is high (i.e. "1", which corresponds to a low supply voltage, as mentioned above), the MOS transistor 24 is off, while the pass transistor 22 is on and in this manner the signal saout is connected both to the gate terminal of the MOS transistor 23 and to the gate terminal of the MOS transistor 20. In this manner, the MOS transistors 23 and 20 are parallel-connected to each other. Accordingly, the output signal 4 is constituted by the current of two parallel-connected P-channel transistors (i.e., the MOS transistors 23 and 20). In this manner, even if the supply voltage Vdd is low, the output current is in any case sufficient, since there is a parallel connection of MOS transistors. If instead the signal LV is low, the MOS transistor 24 is on while the MOS transistor 23 is off and therefore only the branch of the CMOS inverter provided with the MOS transistor 20 is active.

As regards instead the circuit of FIG. 4, in this case too the P-channel MOS transistor 32, again parallel-connected to the P-channel MOS transistor 30, has the same function as shown in FIG. 3 for the P-channel MOS transistor 23. The inverter 33, the NAND gate 34 and the transistor 32 are used to modify the gain of the inverter formed by the transistors 30 and 31 of FIG. 4. If the signal LV is low, i.e., if the circuit operates at standard voltage, the only P-channel MOS transistor that is on is the transistor 30, while the transistor 32 is off and the switching threshold of the inverter is suitable for standard voltage (TTL/CMOS). If instead a low voltage is used and the signal LV is therefore high, the transistor 32 is on and so is the transistor 30 and the switching threshold of the inverter changes in order to adapt to the low-voltage conditions.

With reference now to the synchronization circuit of FIG. 5, the plurality of P-channel MOS transistors 40, together with the signal LV, determines the timing of the signal CK 1. The description that follows applies equally to the plurality of N-channel MOS transistors 41 and to the P-channel MOS transistors 42. In particular, timing is modified by changing the product RC, i.e., the product of the equivalent resistance of the transistors 40 and of the capacitance C, i.e., the load arranged downstream of the synchronization circuit 8. Since the capacitance C cannot be changed, it is necessary to modulate the value of the equivalent resistance R, i.e., the resistance provided by the transistors 40 (the same applies to the transistors 41 and 42). The transistors 41 are arranged in a series/parallel connection, as mentioned, and vary the equivalent resistance according to their connection type. The equivalent resistance change is thus determined by the presence of the high or low signal LV. Selection of the value of the resistance R depends on the number of transistors 40 that are on (driven by the signal LV) and on their dimensions. The above applies likewise to the transistors 41 and to the transistors 42.

In practice it has been observed that the selection circuit according to the invention fully achieves the intended aim, since it allows differentiation between the operating classes of non-volatile semiconductor memories during the last steps of the memory testing by writing the one-time programmable non-volatile memory cell. Of course, this capability to select the operating voltage range must be accompanied, as shown, by a modification of the input and output circuits and of the synchronization circuits of said memories. The capability to determine the requested supply voltage during testing solves production planning problems since the manufacturer is not forced to predefine long in advance the number of devices of a given type to be manufactured. The selection circuit thus conceived is susceptible of numerous modifications and variations, all of which are within the scope of the invention; all the details may also be replaced with other technically equivalent elements.

In practice, the materials employed, so long as they are compatible with the specific use, as well as the dimensions, may be any according to requirements and to the state of the art. Where technical features mentioned in any claim are followed by reference signs, those reference signs have been included for the sole purpose of increasing the intelligibility of the claims and accordingly such reference signs do not have any limiting effect on the interpretation of each element identified by way of example by such reference signs.

What is claimed is:

1. An operating voltage selection circuit for a non-volatile semiconductor memory device, comprising:

means for reading at least one one-time programmable non-volatile memory cell, the means for reading suitable to generate a first signal which indicates a requested type of operating voltage of the non-volatile memory device, wherein the first signal depends on the programmed or non-programmed state of the at least one one-time programmable non-volatile memory cell;

a memory enabling circuit, comprising an enabling inverter and a circuit for modifying a switching threshold of the enabling inverter as a function of the first signal;

an output circuit, connected to output terminals of the non-volatile semiconductor memory device, comprising an output inverter and a circuit for modifying an output current of the output inverter as a function of the first signal; and a circuit for the internal synchronization of the non-volatile semiconductor memory device, comprising one or more sets of transistors, each set of transistors being connected in a series/parallel configuration, and operating to delay the first signal by a predetermined amount in order for the one or more sets of transistors to generate one or more second signals for internally synchronizing the non-volatile semiconductor memory device.

2. The operating voltage selection circuit claim 1, wherein said means for reading comprises a bistable element in which a first branch thereof receives a third signal asserted during power-on of the non-volatile semiconductor memory device and a second branch of the bistable element is connected to the at least one one-time programmable non-volatile memory cell.

3. The operating voltage selection circuit of claim 2, wherein the first signal is taken from an output of the first branch of the bistable element.

4. The operating voltage selection circuit of claim 1, wherein:

the enabling inverter includes a pull-up transistor; and
    the circuit for modifying the switching threshold of the enabling inverter comprises at least one pull-up transistor which is selectively parallel-connected to the pull-up transistor of the enabling inverter.

5. The operating voltage selection circuit of claim 4, wherein said at least one pull-up transistor of the circuit for modifying the switching threshold of the enabling inverter is driven by a signal derived from the first signal.

6. The operating voltage selection circuit of claim 1, wherein:

the output inverter includes a pull-up transistor; and
    said circuit for modifying the output current of the output inverter comprises at least one pull-up transistor which is parallel-connected to the pull-up transistor of the output inverter.

7. The operating voltage selection circuit of claim 6, wherein said circuit for modifying the output current of the output inverter further comprises a circuit for selectively enabling the pull-up transistor, the circuit for selectively enabling having as an input the first signal.

8. The operating voltage selection circuit according to claim 1, wherein said circuit for the internal synchronization comprises a first, a second and a third set of MOS transistors which are each series/parallel connected in order to generate a first, a second and a third synchronization signal, respectively.

9. The operating voltage selection circuit of claim 1, wherein the one or more sets of transistors comprises at least one delay element for introducing at least one predetermined RC delay on the one or more second signals based upon the first signal.

10. The operating voltage selection circuit of claim 9, wherein:

the one or more sets of transistors delays a falling edge of at least one of the one or more second signals relative to a corresponding edge of the first signal.

11. The operating voltage selection circuit of claim 9, wherein:

the circuit for the internal synchronization includes a signal path between the first signal and the one or more second signals; and the one or more sets of transistors is connected in the signal path and comprises a plurality of transistors configured as one of a pull-up device and a pull-down device, the transistors being activated by the first signal.

12. The operating voltage selection circuit of claim 9, wherein:

the one or more sets of transistors delays a rising edge of at least one of the one or more second signals relative to a corresponding edge of the first signal.

13. A circuit for configuring a semiconductor memory device, comprising:

a supply indicating circuit for generating an indicating signal based upon a voltage supply level used to supply power to the semiconductor memory device, a value of the indicating signal corresponding to the voltage supply level; and a synchronization circuit, connected to the supply indicating circuit, for generating one or more synchronization signals for synchronizing internal circuitry of the semiconductor memory device, the one or more synchronization signals being delayed by a predetermined amount of time relative to the indicating signal.

14. The circuit of claim 13, wherein:

the synchronization circuit comprises at least one delay element coupled to the indicating signal for delaying the one or more synchronization signals relative to the indicating signal.

15. The circuit of claim 14, wherein:

the at least one delay element comprises one of a pull-up device and a pull-down device activated by the indicating signal coupled thereto.

16. The circuit of claim 15, wherein:

the delay element comprises a plurality of transistors connected together.

17. The circuit of claim 13, wherein:

the synchronization circuit generates a plurality of synchronization signals for synchronizing the internal circuitry of the semiconductor memory device, each synchronization signal being delayed by a distinct predetermined amount relative to the indicating signal.

18. The circuit of claim 17, wherein:

a delay of at least one synchronization signal, relative to the indicating signal, is based upon a delay of another of the synchronization signals, relative to the indicating signal.

19. The circuit of claim 17, wherein:

the synchronization circuit comprises a plurality of delay element circuits, each delay element circuit is connected to and effects a transition time of a distinct node in the synchronization circuit.

20. The circuit of claim 13, further comprising:

an output circuit, connected to the supply indicating circuit, for generating a data output signal of the semiconductor memory device, an output current level of the output circuit being dependent upon the value of the indicating signal.

21. The circuit of claim 13, further comprising:

an enable circuit, connected to the supply indicating circuit, for generating an enabling signal that enables the semiconductor memory device, a switching threshold voltage level of the enabling circuit being dependent upon the value of the indicating signal.

22. A method for configuring a semiconductor memory device, comprising the steps of:

applying a power supply to the semiconductor memory device having a predetermined voltage supply level;

generating an indicating signal based upon the predetermined voltage supply level; and generating one or more synchronization signals for synchronizing circuits internal to the semiconductor memory device by delaying the one or more synchronization signals a predetermined amount of time relative to the indicating signal.

23. The method of claim 22, wherein:

the step of generating comprises delaying the indicating signal from appearing on the one or more synchronization signals by the predetermined amount of time.

24. The method of claim 22, wherein:

the step of generating comprises the step of generating a plurality of synchronization signals, each synchronization signal being delayed a distinct predetermined period of time relative to the indicating signal.

25. The method of claim 24, wherein:

the distinct predetermined period of time of delay for a first synchronization signal is based upon the distinct predetermined period of time of delay for a second synchronization signal.

26. The method of claim 22, further comprising the step of:

generating an output signal corresponding to data stored in an addressed memory cell having an output current level based upon the level of the indicating signal.

27. The method of claim 22, further comprising the step of:

generating an enable signal for enabling at least a portion of the semiconductor memory device having a switching threshold based upon the level of the indicating signal.

* * * * *

UNITED STATES PATENT AND TRADEMARK OFFICE
CERTIFICATE OF CORRECTION

PATENT NO. : 6,101,127  Page 1 of 1
DATED : August 8, 2000
INVENTOR(S) : Rolandi It is certified that error appears in the above-identified patent and that said Letters Patent is hereby corrected as shown below:

<u>Title page,</u>
Item [56], replace "5,930,170 3/1999" with -- 5,930,170 7/1999 --: and
Replace "0 802 482 A1  10/1997" with -- EP 0 802 482 A1 10/1997 --

<u>Column 3,</u>
Line 56, replace "and a signal" with -- and signal --

<u>Column 6,</u>
Line 18, replace "circuit," with -- circuit --
Line 3, replace "configuration," with -- configuration --

Signed and Sealed this

Sixteenth Day of July, 2002

Attest:

Attesting Officer

JAMES E. ROGAN
*Director of the United States Patent and Trademark Office*